United States Patent [19]
Heiss

[11] Patent Number: 5,703,761
[45] Date of Patent: Dec. 30, 1997

[54] SHIELDING FOR FLAT MODULES

[75] Inventor: Reinhold Heiss, Deutenhausen, Germany

[73] Assignee: Siemens Aktiengesellschaft, Munich, Germany

[21] Appl. No.: 699,327

[22] Filed: Aug. 19, 1996

[30] Foreign Application Priority Data

Sep. 7, 1995 [DE] Germany .............. 295 14 398.3

[51] Int. Cl.⁶ .................................................. H05K 7/14
[52] U.S. Cl. .................. 361/800; 361/816; 361/753; 361/739; 174/35 GC
[58] Field of Search .................................. 361/719, 720, 361/728, 730, 736, 737, 743, 745, 748, 752, 757, 760, 761, 796, 800, 803, 807, 817, 818, 799, 753; 174/35 GC, 50, 51, 52.1, 35 R, 35 TS; 257/659, 728

[56] References Cited

U.S. PATENT DOCUMENTS

| | | | |
|---|---|---|---|
| 5,166,864 | 11/1992 | Chitwood et al. | 361/720 |
| 5,353,201 | 10/1994 | Maeda | 361/816 |

FOREIGN PATENT DOCUMENTS

| | | | |
|---|---|---|---|
| 62-86841 (A) | 4/1987 | Japan | 257/659 |
| 4-23497 (A) | 1/1992 | Japan | 361/818 |
| 4-58596 (A) | 2/1992 | Japan | 361/818 |

Primary Examiner—Leo P. Picard
Assistant Examiner—Anthony Dinkins
Attorney, Agent, or Firm—Hill, Steadman & Simpson

[57] ABSTRACT

For shielding of flat modules having high-frequency components in information technology equipment, a surface of the shielding extends only over a region of the components to be shielded. The shielding surface is connected in an electrically conductive manner with a contact surface on the circuit board that surrounds the components.

3 Claims, 1 Drawing Sheet

SHIELDING FOR FLAT MODULES

BACKGROUND OF THE INVENTION

The present invention concerns a shielding for flat modules having high-frequency components in information technology equipment.

The high-frequency modules of mobile radiotelephone equipment or of equipment with comparable requirements must be shielded against disturbing radiation and disturbing transmission.

Known solutions are based on specific shielding techniques of the environment, e.g. of the housing parts surrounding the high-frequency modules, or through individual shielding parts. Disadvantages of these solutions include the expensive electrical contacting between the shielded housing parts or between the shielding parts and the contact surfaces of the flat modules to be shielded. Another disadvantage is that it is difficult to test the shielding function during manufacturing, since the shielding first takes effect in the assembled state, i.e. in the device as a whole. For a test in the production line, expensive "dummy solutions," as they are known, must thus be used.

SUMMARY OF THE INVENTION

An object of the present invention is to indicate a shielding of the type named above that is easy to manufacture and enables testing during production before the final assembly.

This object is solved for a shielding of the type named above since the shielding surface extends only over the region of the components to be shielded, and is connected in an electrically conductive manner with a contact surface on the circuit board, which surface surrounds the components and conducts shielding potential.

The shielding of the invention offers the advantage that the shielding techniques extend only on the actual module. A simple manufacture of the shielding is thus possible. At the same time, a testing of the shielding function is possible after the manufacturing of the individual modules and before the actual final assembly.

A useful construction of the invention is that the shielding surface is comprised of a metal lamination of a deep-drawn plastic film, whereby the plastic film, laminated with the conductive material, is welded with the circuit board contact surface that conducts the shielding potential. In this way it is possible to carry out a pre-production of the shielding for modules to be shielded having the same dimensions.

Another useful construction of the invention is that the shielding surface is made of a conductive surface on a non-conductive layer covering the components and the associated circuit board region, which layer is connected in an electrically conductive manner with the circuit board contact surface that conducts the shielding potential. In this construction, a pre-production of the shielding is not possible; however, this embodiment offers the advantage that the space requirement for the shielding can be reduced to a minimum.

In the following, the invention is specified in more detail on the basis of two exemplary embodiments, shown in the drawings.

DESCRIPTION OF THE PREFERRED EMBODIMENTS

Figure 1:
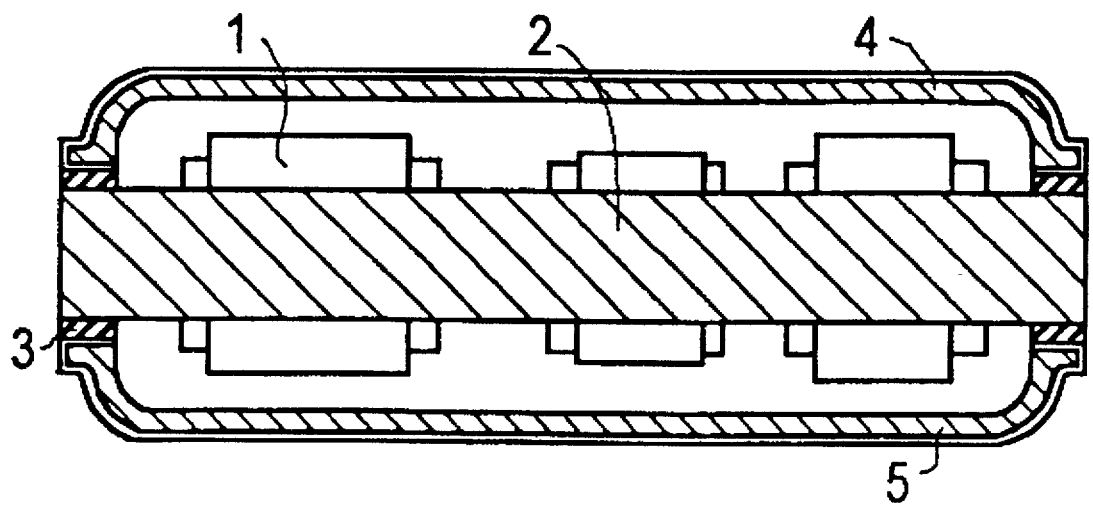
FIG. 1 illustrates in cross-section a shielding according to the invention using a plastic film laminated with a conductive material.

FIG. 1 shows a shielding according to the present invention. High-frequency components 1 and other components are arranged on a circuit board 2, the components forming a flat module to be shielded on a part or on the entire circuit board.

For the shielding of the flat module, a deep-drawn plastic film 5, laminated on one side, is used. In this case, the metal lamination 4 of the plastic film 5 serves as a shielding surface. For the metal lamination 4, copper, silver, gold, etc., may, for example, be used as the metal.

The metal lamination 4 is connected in an electrically conductive manner, e.g. by means of ultrasonic welding, with the contact surface 3 of the circuit board 2 that conducts the shielding potential. The contact surface 3 that conducts the shielding potential can be e.g. a contact path surrounding the components 1 concerned.

In the case here described, the one-sided lamination of the plastic film 5 can occur on the side of the plastic film 5 facing the components 1 or on the side facing away from the components, according to further requirements.

Figure 2:
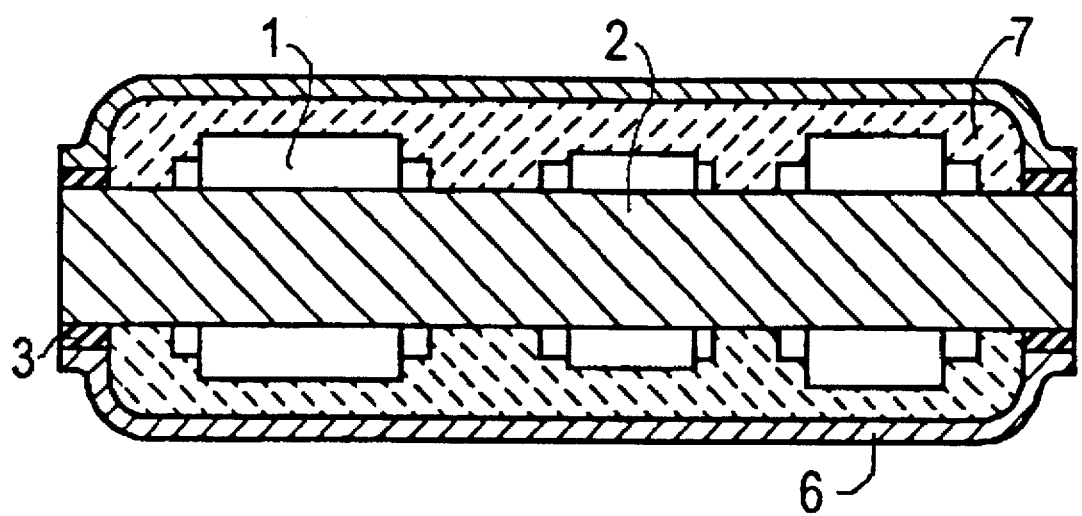
FIG. 2 illustrates in cross-section a shielding of the invention using a non-conductive layer having a conductive surface.

FIG. 2 shows a shielding also according to the present invention. In this case as well, high-frequency components 1 and other components are arranged on a circuit board 2, the components forming a flat module to be shielded at a part or on the entire circuit board 2.

In this exemplary embodiment, the shielding is achieved in that at first either a thin non-conductive layer 7, made e.g. of silicon rubber, or a thin non-conductive layer of lacquer is attached. This non-conductive layer 7 fits the contours of the flat module. Subsequently, the flat module formed in this way is coated with a conductive surface 6, e.g. which is metalized, whereby in this case as well, the contacting with the circuit board contact surface 3 that conducts the shielding potential is created by means of the coating.

In the last-described exemplary embodiment, it is to be noted that during the attaching of the non-conductive layer 7 the contact surface 3 of the circuit board 2 that conducts the shielding potential is left free.

The respective advantages and disadvantages of the two constructions of the shielding of the invention have already been stated in the introduction to the specification.

Although various minor changes and modifications might be proposed by those skilled in the art, it will be understood that my wish is to include within the claims of the patent warranted hereon all such changes and modifications as reasonably come within my contribution to the art.

I claim as my invention:

1. A shielding for flat modules formed of high-frequency components on a circuit board in information technology equipment, comprising:

a surface extending only over a region of components to be shielded and which is connected in an electrically conductive manner with a contact surface on the circuit board, said shielding surface surrounding the components and conducting a shielding potential; and the shielding surface comprising a metal lamination of a deep-drawn plastic film, the plastic film laminated with the conductive material being welded with the contact surface of the circuit board that conducts the shielding potential.

2. A shielding for certain ones of a plurality of components on a circuit board, comprising:

a shielding surface extending only over a region of said certain components to be shielded but not over others of said plurality of components not to be shielded, said shielding surface being electrically connected with a contact surface on the circuit board adjacent said certain components;

said shielding surface surrounding only said certain components and in contact with said contact surface at the certain components; and the shielding surface comprising a metal lamination overlying a deep drawn plastic film which lies over and is spaced above the certain components.

3. The shielding according to claim 2 wherein two of said shielding surfaces are provided, a first shielding surface being on one side of the circuit board and a second shielding surface on an opposite side of the circuit board directly opposite the first shielding surface.

* * * * *